US010107648B2

(12) United States Patent
Borgiani et al.

(10) Patent No.: US 10,107,648 B2
(45) Date of Patent: Oct. 23, 2018

(54) ABSOLUTE CAPACITATIVE ENCODER

(71) Applicants: ERS-SOCIETA' A RESPONSABILITA' LIMITATA, Ancona (IT); EVEREL GROUP S.P.A., Mincio (IT)

(72) Inventors: Marco Borgiani, Ancona (IT); Diego Cerioni, Falconara Marittima (IT); Michele Squicciarini, Castegnato (IT)

(73) Assignees: ERS-SOCIETA' A RESPONSABILITA' LIMITATA, Ancona (IT); EVEREL GROUP S.P.A., Mincio (VR) (IT)

( * ) Notice: Subject to any disclaimer, the term of this patent is extended or adjusted under 35 U.S.C. 154(b) by 0 days.

(21) Appl. No.: 14/873,682

(22) Filed: Oct. 2, 2015

(65) Prior Publication Data
US 2016/0097657 A1    Apr. 7, 2016

(30) Foreign Application Priority Data
Oct. 3, 2014    (IT) .......................... AN2014A000148

(51) Int. Cl.
*G01D 5/24* (2006.01)
*G01D 5/241* (2006.01)
*H03K 17/975* (2006.01)

(52) U.S. Cl.
CPC ......... *G01D 5/2415* (2013.01); *G01D 5/2405* (2013.01); *H03K 17/975* (2013.01); *H03K 2217/94068* (2013.01); *H03K 2217/96066* (2013.01)

(58) Field of Classification Search
CPC ....... G01D 5/24; G01D 5/2415; G01D 5/2497
See application file for complete search history.

(56) References Cited

U.S. PATENT DOCUMENTS

| | | | | |
|---|---|---|---|---|
| 3,198,937 A | * | 8/1965 | Wooster | G05D 3/127 318/602 |
| 2004/0085079 A1 | * | 5/2004 | Lin | G01D 5/2405 324/662 |
| 2006/0012944 A1 | * | 1/2006 | Mamigonians | G06F 3/044 361/303 |
| 2006/0067677 A1 | * | 3/2006 | Tokiwa | G03B 17/38 396/502 |
| 2009/0064809 A1 | | 3/2009 | Miret et al. | |
| 2013/0229339 A1 | * | 9/2013 | Takahata | G06F 3/016 345/156 |
| 2015/0362336 A1 | * | 12/2015 | Cook | G01D 5/20 324/207.16 |

FOREIGN PATENT DOCUMENTS

EP        0920042 A2    6/1999

* cited by examiner

*Primary Examiner* — Noam Reisner
(74) *Attorney, Agent, or Firm* — Egbert Law Offices, PLLC

(57) ABSTRACT

An absolute capacitative encoder includes a PCB, a plurality of conductive sectors that generate capacitors, a rotor mounted in revolving and/or axially translating mode with respect to the PCB, the rotor being made of dielectric material and having a peripheral slot in register with the conductive sectors, a control unit electrically connected to the conductive sectors in such manner to detect the capacity of each capacitor generated by the conductive sectors, the control unit being set in such manner to detect the capacity variation between the capacitors during the rotation and/or axial translation of the rotor in order to detect the angular and/or axial position of the rotor.

5 Claims, 3 Drawing Sheets

ABSOLUTE CAPACITATIVE ENCODER

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The present patent application for industrial invention relates to an absolute angular and/or linear encoder based on a capacitative coupling principle. Such an encoder is able to send information on the angular and/or linear position of a mobile element to an electronic device, such as a display that displays such information on the position.

2. Description of Related Art Including Information Disclosed Under 37 CFR 1.97 and 37 CFR 1.98

It is often necessary to have information on the angular and linear position of a mobile element (for example a knob with an integrated button). It is also possible to transmit the information on the angular and linear position in order to be used by another system.

Position transducer devices with similar characteristics are typically used in household appliances, and also in other applications.

Said position transducer devices comprise a shaft that can be rotated either manually or by means of a motor to generate an electrical signal. The electrical signal generated by the device can be a resistance value or a sequence or electronic configuration of bits. The term "potentiometric device" can be used when the output of the detection device is a resistance value, whereas the term "encoder" is used alternatively.

An encoder comprises three main parts: an electronic printed circuit board (PCB), a rotor and a shaft. Various parts are generally assembled on the PCB, such as: resistive devices, microcontrollers, capacitors, conductive tracks, carbon film tracks and other devices. Encoders generally use mechanical rotary friction contacts between the rotor and the PCB to produce an electronic signal that corresponds to each angular position of the rotor.

Relative or incremental encoders as well as absolute encoders are known.

In relative encoders the electrical output signals are proportional to the displacement of the rotor with respect to a fixed reference point. Simple circuits can read and display the speed and acceleration of the rotor axis, but not the instantaneous position.

In absolute encoders the electrical output signals encode the exact instantaneous position of the rotor with respect to a fixed reference point. In such a way, at any time, a suitable decoding circuit can decode and display the angular position of the rotor axis. The displacement data of the axis (direction, speed and acceleration) are obtained processing its absolute position in time.

The following devices are known:
resistive potentiometers and absolute angular and linear encoders with mechanical rotary friction contacts,
absolute or incremental optical angular encoders,
absolute or incremental magnetic angular encoders,
incremental capacitative angular encoders.

Nevertheless the aforementioned devices are impaired by the following drawbacks:
resistive or rotary contact encoders/potentiometers are subject to rapid wear of the contact elements, which are necessarily of friction type, and have large dimensions (which are difficult to miniaturize) in the direction of the rotor axis of rotation.

The dimensions of the optical encoders are difficult to miniaturize in the direction of the rotor axis of rotation.

Capacitative encoders are only used as incremental, not absolute encoders. In fact, the armatures used to detect the rotation of the rotor cannot be used to detect also the distance of the rotor from the stator. Moreover, the stator and rotor armatures of capacitative encoders must be electrically connected to the measuring and control electronics.

US2009/0064809 discloses a rotary knob assembly provided with a stator with a plurality of conductive sectors disposed in linear arrangement that form armatures of capacitors and small conductive cursors mounted in peripheral position in the knob to generate a capacity variation in the stator capacitors.

US2006/0012944 discloses a mechanically operable electrical device comprising capacitor armatures disposed in circumferential arrangement in a stator and a rotary element provided with a small radial conductive region to generate a capacity variation in the stator capacitors.

EP0920042 discloses an apparatus panel comprising a plurality of capacitor armatures disposed in circumferential arrangement in a stator and a rotary element with a conductive indicator that extends radially from the rotary element to generate a capacity variation in the stator capacitors.

US2009/0064809, US2006/0012944 and EP0920042 disclose a rotary element provided with a conductive section with a considerably lower surface compared to the non-conductive section of the rotary element. The conductive section of the rotary element has basically the same dimensions as a single stator armature. Consequently, the capacity variation of a single stator armature is analyzed upon the passage of the conductive cursor. In view of the above, only one stator armature affects the calculation of the capacity variation, whereas no contribution is given by the other stator armatures. This clearly involves evident resolution limits.

In order to partially solve such a drawback, US2006/0012944 and EP0920042 teach to ground the conductive section of the rotor in order to screen the stator armature covered by the conductive section of the rotor with respect to the other stator armatures. Evidently, the ground connection of a rotary element is complicated and not very reliable.

The purpose of the present invention is to eliminate the drawbacks of the prior art by providing a capacitative encoder able to detect with capacitative measures the absolute angular and linear position of the mobile element of the encoder not electrically connected to the measuring and control electronics.

Another purpose of the present invention is to provide a rotary encoder that is reliable and easy to make.

A further purpose of the present invention is to provide a rotary encoder that is suitable for being used as knob that provides for both rotation and translation.

BRIEF SUMMARY OF THE INVENTION

These purposes are achieved according to the invention, with the characteristics claimed in the independent claim 1. Advantageous embodiments of the invention appear from the dependent claims.

The absolute capacitative encoder of the invention comprises:
- a stator,
- a plurality of conductive sectors mounted on said stator, one next to the other, in such manner to generate a plurality of capacitors having said conductive sectors as armatures,
- a mobile element mounted in revolving and/or translating mode with respect to the stator, said mobile element having an indicator, and
- a control unit electrically connected to said stator conductive sectors in such manner to detect the capacity of each capacitor generated by the conductive sectors.

The indicator of the mobile element consists in a slot of the mobile element.

The mobile element is configured in such manner to cover all stator capacitors when moving, except for one stator capacitor in correspondence of the slot of the mobile element, and the control unit is set in such manner to detect the capacity variation between all stator capacitors covered by the mobile element and the only stator capacitor that is not covered by the mobile element in correspondence of the slot of the mobile element, in such manner to identify the position of the indicator of the mobile element.

Considering that the mobile element behaves as a dielectric that covers all stator capacitors except for one, each stator capacitor covered by the mobile element will have a capacity value amplified by the presence of all stator capacitors covered by the mobile element. In such a case, by means of suitable charge algorithms of the individual stator capacitors, it is easy to see each stator capacitor as having a surface (and therefore a capacity) that is the sum of all the capacities of the stator capacitors covered by the mobile element. The difference in capacity between the capacitors covered by the mobile element and the free capacitor (in correspondence of the slot of the mobile element) will be a function of the number of capacitors covered by the mobile element and therefore the discrimination level between the two statuses (covered capacitors and non-covered capacitors) will be amplified according to the number of capacitors, thus considerably improving the resolution compared to the prior art.

For example, if the stator capacitors are numbered progressively (1, 2, ... N, ... ), when capacitor N is under the solid part of the mobile element, the capacity of capacitor N is a function of the dielectric constant of the mobile element and of all other capacitors covered by the mobile element. When capacitor N is not covered by the mobile element (i.e. in correspondence of the slot of the mobile element), its value is zero, thus producing minimum noise induced by the adjacent capacitors.

Such a configuration allows for making a mobile element without any electrical connection (line, neutral or ground) and ensures a discrimination of the capacitor capacities such that the mobile element can be used both as an absolute rotary encoder and as a knob that can be used both in rotation and in translation just like a button. In fact, if the rotor translates along its axis of rotation, the capacity of the parallel of all stator capacitors covered by the rotor is a function of the distance between rotor and stator.

Advantageously, the conductive sectors are disposed in circular crown configuration with a center and the mobile element is a rotor that is revolvingly mounted around an axis orthogonal to the stator passing through the center of the circular crown configuration. In such a case the control unit is set in such manner to detect the capacity variation between the capacitors during the rotation of the rotor, thus acting as absolute rotating encoder.

Moreover, the rotor can be mounted in such way to translate axially with respect to an orthogonal axis passing through the center of the configuration of conductive sectors. In such a case the control unit is set in such manner to detect the capacity variation between the capacitors during the axial translation of the rotor that acts as a push button.

Advantageously, the stator is a PCB, and therefore, with a PCB provided with conductive sectors that generate capacitors and with a passive rotor and without electrical contacts, the encoder of the invention detects the angular position and/or the linear distance of the rotor with respect to the stator (PCB), correlating with a suitable function the capacitative values detected on each armature designed in the PCB.

The encoder of the invention has the following advantages:
1. detection of the linear distance of the rotor with respect to the stator (i.e. push button function) using the same armatures used to detect the angular position of the rotor with respect to the stator;
2. detection of the angular and/or linear position of the rotor with respect to the stator using only the matrix of stator armatures and without active armatures in the rotor;
3. significant dimensional reduction in the direction of the rotor axis of mechanical rotation;
4. absence of friction contacts in the measuring chain and absence of mechanical wear of the measuring system.

The capacitative measuring system of the invention detects the capacities of the elements of the matrix of armatures designed in the PCB (stator) and sends them to the control unit that memorizes the capacity value matrix. Any angular and/or linear variation of the rotor with respect to the stator produces a variation of the values of the elements of the capacity matrix, thus allowing the control unit to determine the angular and linear position of the rotor with respect to the stator by means of specific algorithms.

BRIEF DESCRIPTION OF THE SEVERAL VIEWS OF THE DRAWINGS

Additional features of the invention will appear evident from the detailed description below, which refers to a merely illustrative, not limiting, embodiment, illustrated in the attached drawings.

DETAILED DESCRIPTION OF THE INVENTION

Figure 1:
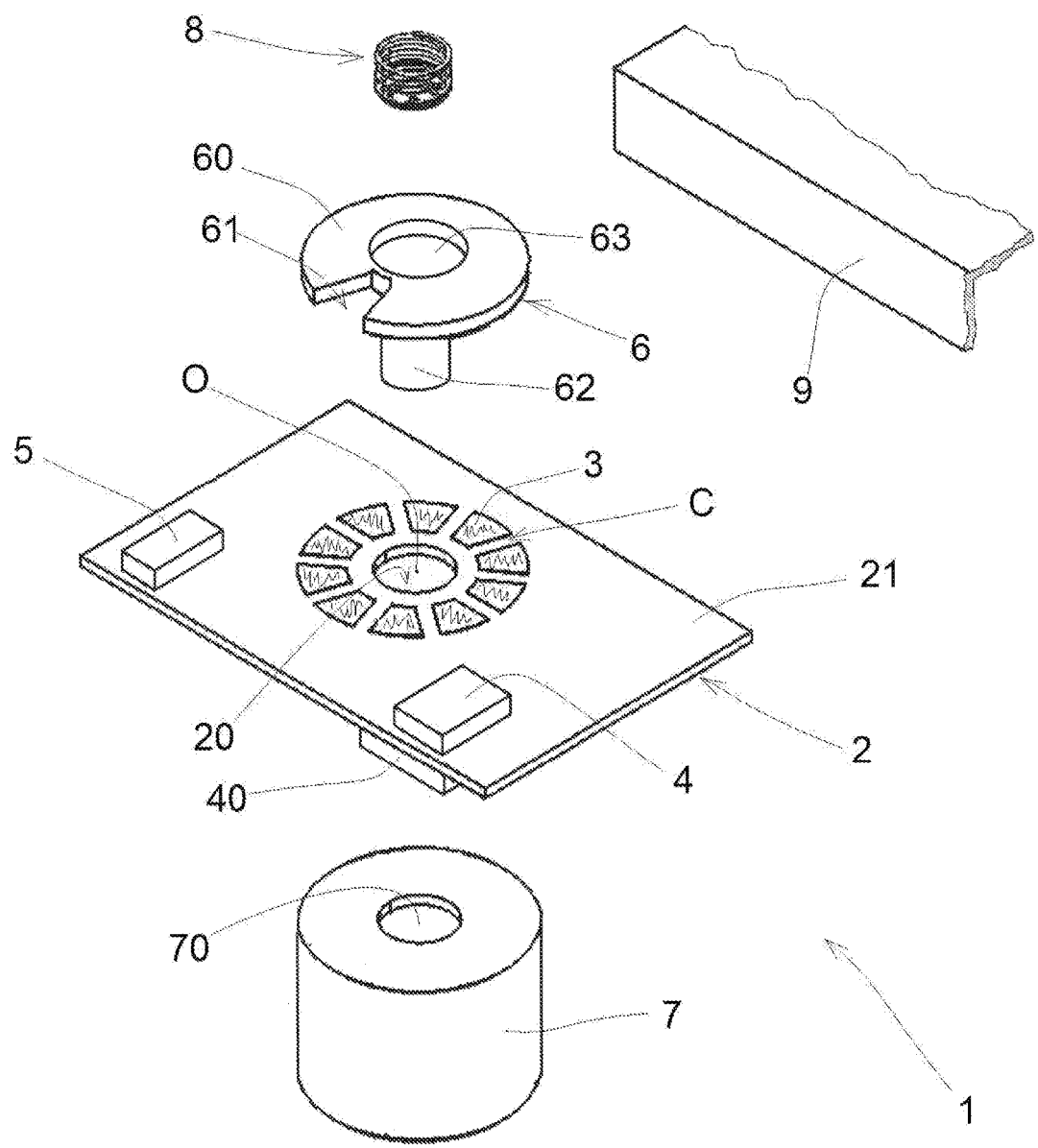
FIG. 1 is an exploded perspective view of the various parts of the encoder of the invention.
Figure 2:
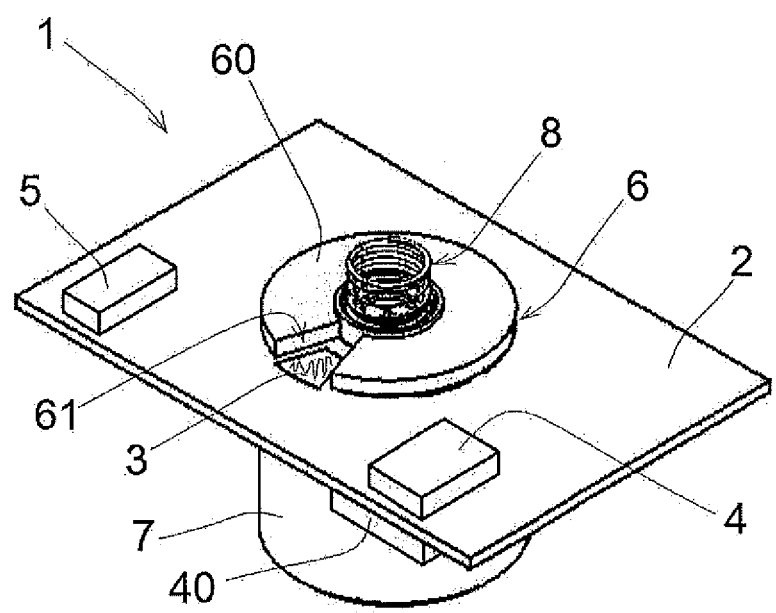
FIG. 2 is a perspective view of the encoder of FIG. 1 in assembled condition.

Referring to FIGS. 1 to 4, a first embodiment of the encoder of the invention is disclosed, being generally indicated with reference numeral (1).

The encoder (1) comprises a stator composed of a printed circuit board (PCB) (2) with a front side (200) (FIG. 3) intended to be faced towards the user and a back side (21) disposed in opposite position to the front side.

A plurality of conductive sectors (3) is mounted on the back side (21) of the PCB (2), one next to the other and spaced in such way that two adjacent conductive sectors (3) generate the armatures of a capacitor (C). The conductive sectors are made of a conductive metal, such as for example copper.

The conductive sectors (3) are disposed in a configuration shaped as a circular crown around a center (O). For illustrative purposes, FIG. 1 illustrates 10 conductive sectors (3) that are equally spaced by an angle of 36° in such manner to generate a matrix of 10 capacitors (C).

Each conductive sector (3) has circular asymmetry. In particular, each conductive sector (3) has a tapered shape with increasing dimensions going from the center (O) to the periphery. For example, each conductive sector (3) is made of a plate that is substantially shaped as an equilateral trapezium with its minor base facing towards the center (O).

The conductive sectors (3) are in electrical communication with a control unit (4) intended to detect the capacity variation of each capacitor (C). For example, the conductive sectors (3) are electrically connected to the control unit (4) by means of conductive tracks (not shown in the drawings) obtained on the PCB (2).

An electrical connector (5) is mounted on the PCB (2). The electrical connector is electrically connected to the control unit (4). A power supply (not shown in the figures) is connected to the electrical connector (5) to power the control unit (4).

The encoder (1) comprises a mobile element consisting in a rotor (6) revolvingly mounted on the PCB (2) in such manner to rotate around an axis of rotation orthogonal to the PCB, passing through the center (O) of the layout of the conductive sectors (3). The rotor (6) comprises a disk (60) made of dielectric non-conductive or conductive material, which is disposed on the conductive sectors (3).

The disk (60) of the rotor has an asymmetry of the constant or dielectric coefficient value that generates a corresponding asymmetry in the capacity value of the stator armatures. Such an asymmetry of the dielectric constant value of the rotor can be obtained, for example, by means of geometric asymmetry of the rotor disk (60). In the example shown in the figures, such a geometric asymmetry of the disk (60) of the rotor is a peripheral slot (61) disposed in register with the conductive sectors (3) of the PCB. The slot (61) of the rotor disk acts as indicator.

In such a case, the peripheral slot (61) of the rotor disk has the same dimensions or slightly larger dimensions than a single conductive sector (3) and represents the desired asymmetry.

The peripheral slot (61) may have a width in circumferential direction higher than the distance between two adjacent conductive sectors (3) and lower than the sum of the widths of two conductive sectors.

In view of the above, the material of the disk (60) acts as dielectric for all capacitors (C) of the PCB, except for one capacitor (C) on which the peripheral slot of the disk (60) is situated. In fact, the capacitor (C) on which the peripheral slot (61) is situated will have air as dielectric, and air has a different dielectric coefficient compared to the rotor material. As a consequence, the capacity of the capacitor disposed under the peripheral slot of the rotor will be different from the capacity of the other capacitors that are disposed under the disk (60). In view of the above, the control unit (4) can detect which capacitor is disposed under the radial slot (61) of the rotor and therefore the control unit (4) can detect the angular position of the rotor (6) indicated by the indicator of the rotor represented by the slot (61).

The PCB is provided with a through hole (20) having the center (O) of the layout of the conductive sectors (3) as center.

The rotor (6) comprises a shank (62) that protrudes axially from the disk (60) in order to be inserted in the hole (20) of the PCB.

A knob or button (7) is fixed to the shank (62) of the rotor in such manner to protrude from the front surface (200) of the PCB and be actuated by the user. The knob (7) has an axial seat (70) to receive the shank (62) of the rotor. The coupling between the shank (62) of the rotor and the seat (70) of the knob can be any type of coupling that prevents the mutual rotation between rotor and knob, such as for example screwing with locking, keying, or the like. In such a way, a rotation of the knob (7) corresponds to a rotation of the rotor (6) and the control unit (4) can detect the angular position of the knob (7).

Advantageously, the encoder comprises a display (40) disposed in the front side (200) of the PCB in order to be seen by the user. The display (40) is connected to the control unit (4) to display the angular position of the knob (7).

Although not shown in the figures, evidently the knob (7) instead of the seat (70) can be provided with a shank that is engaged in a housing of the disk (6) of the rotor. Moreover, a bush or a bearing can be mounted in the hole (20) of the PCB, said bush or bearing revolvingly supporting the shank (62) of the rotor.

The disk (60) of the rotor is provided with a seat (63) disposed in opposite position to the shank (62). Spring means (8), such as a helicoidal spring, are disposed in the seat (63). The spring (8) is disposed between the rotor (6) and a cover (9) wherein the PCB (2) is fixed. The spring (8) is partially compressed in such manner to push the disk (60) of the rotor onto the conductive sectors (3), as shown in FIG. 3.

Figure 3:
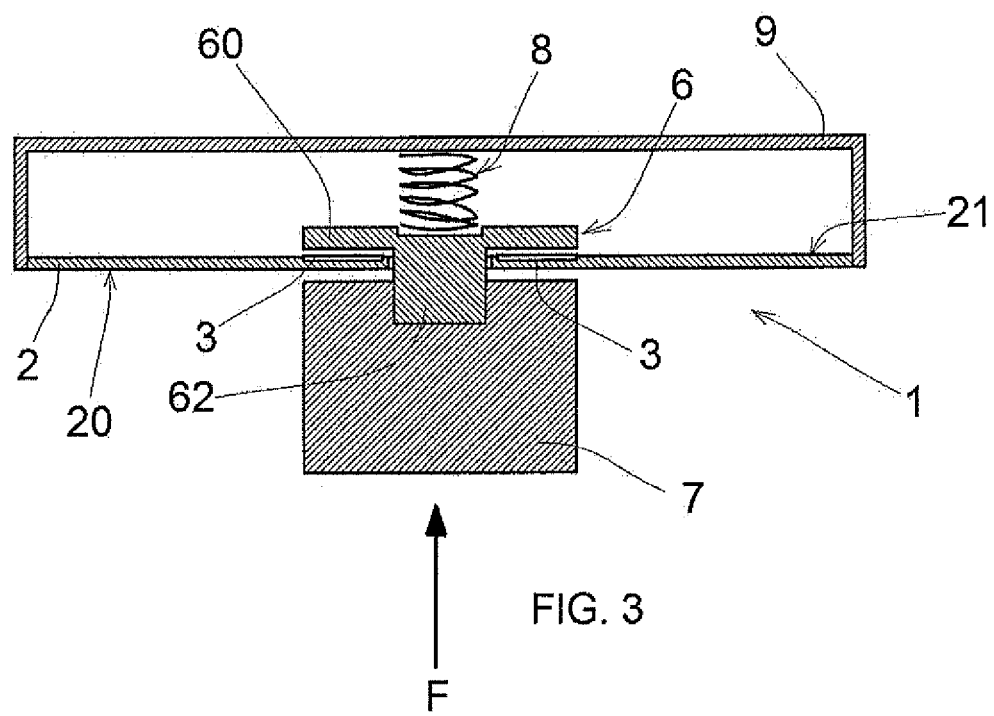
FIG. 3 is an axial sectional view of the encoder of FIG. 2, when the knob is in idle position.
Figure 4:
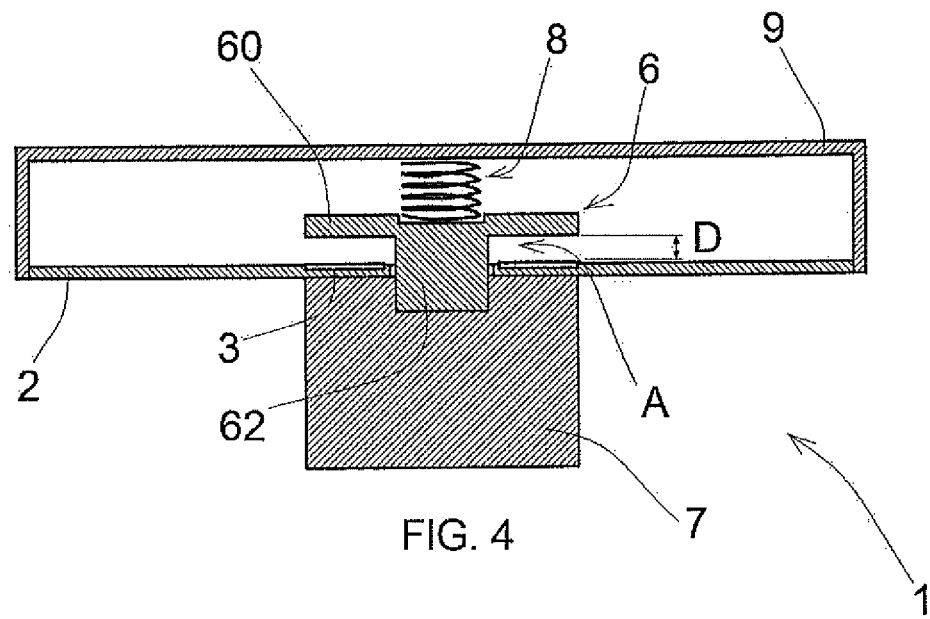
FIG. 4 is the same view as FIG. 3, when the knob is pressed.

If the user pushes the knob (7) in the direction of the arrow (F) of FIG. 3, the rotor (6) will move axially compressing the spring (8) as shown in FIG. 4. As a consequence, the disk (60) of the rotor is moved away from the conductive sectors (3) by a distance (D), generating an air gap (A) between the disk (60) of the rotor and the conductive sectors. Such an air gap (A) changes the dielectric between the capacitors (C) and consequently changes the capacity of the capacitors (C). Such a capacity variation of the capacitors (C) is detected by the control unit and interpreted as an axial displacement of the rotor (6) and therefore as a compression of the knob (7). When the user releases the knob (7) the spring which was compressed is unloaded and the rotor returns to the starting position, with the disk (60) stopped against the conductive sectors (3).

It must be considered that because of the circular asymmetry of the conductive sectors (3) both the variation of the angular position of the rotor and the variation of the linear position of the rotor can be detected (distance of the rotor from the stator (PCB)).

Evidently, such a type of encoder is especially suitable for being used in household appliances. In fact, the operating cycle of the household appliance can be displayed on the display (40) by rotating the knob (7). By pressing the knob (7) the operating cycle displayed on the display is selected.

Figure 5:
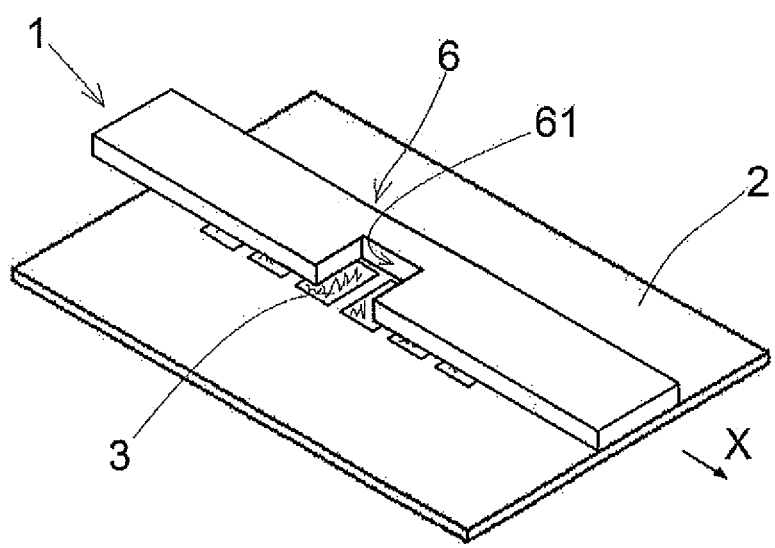
FIG. 5 is a perspective view showing a different embodiment of the encoder of FIG. 2.

FIG. 5 shows an another embodiment of the encoder (1), in which the stator conductive sectors (3) are disposed in a linear sequence along an axis (X) parallel to the surface of the stator (2) in such manner to form an array of capacitors (C). The mobile element (6) is mounted in such a way to slide linearly along the axis (X) of the linear sequence of the conductive sectors (3), thus forming a linear slider. In such a case the conductive sectors (3) can have a rectangular shape. The mobile element (6) has a parallelepiped shape and the asymmetry (61) of the mobile element (6) is represented by a rectangular slot (61). In such a case the length of the mobile element (6) must be at least double than the length of the linear sequence of conductive sectors (3) and the slot (61) must be disposed in an intermediate position of the mobile element in such manner to ensure that the mobile element always covers all capacitors (C) except for one.

Equivalent variations and modifications within the reach of an expert of the field can be made to the present embodiments of the invention while still falling within the scope of the invention.

We claim:

1. An absolute capacitative encoder comprising:
   a stator;
   a plurality of conductive sectors mounted one next to the other on said stator so as to generate a plurality of capacitors that have said plurality of conductive sectors as armatures, said plurality of conductive sectors being disposed in a circular crown configuration and having a center;
   a mobile element revolvingly mounted with respect to said stator, said mobile element being a rotor that is revolvingly mounted around said center, said rotor being a dielectric without a grounded conductive part, said mobile element having an indicator in a slot of said mobile element, said mobile element covering all of said plurality of capacitors when moving except for the capacitor corresponding to said indicator;
   a control unit electrically connected to said plurality of conductive sectors so as to detect a capacity of each of said plurality of capacitors, said control unit detecting a capacity variation between all of the capacitors covered by said mobile element and detecting the capacitor corresponding to said indicator so as to identify a position of said indicator, said rotor being mounted so as to axially translate along an axis orthogonal to said stator passing through the center of the circular crown configuration of said plurality of conductive sectors;
   a cover to which said stator is fixed;
   a spring disposed between said cover and said mobile element so as to urge said mobile element against said plurality of conductive sectors; and
   a knob affixed to said rotor so as to be rotated or pressed such that said control unit detects an angular position and a compression of said knob, said rotor moving axially and compressing said spring when said knob is pressed such that a disk of said rotor is moved away from said plurality of conductive sectors by a distance so as to form an air gap between said disk and said plurality of conductive sectors, the air gap changing a dielectric between said plurality of capacitors such that the capacity of said plurality of capacitors changes.

2. The absolute capacitive encoder of claim 1, wherein said mobile element has no active electronic elements or electrical connections.

3. The absolute capacitive encoder of claim 1, said slot having a substantially identical or a slightly larger dimension than a single conductive sector of said plurality of conductive sectors, said slot having a width in a circumferential direction that is greater than a distance between two adjacent conductive sectors of said plurality of conductive sectors and less than a sum of a width of the two adjacent conductive sectors.

4. The absolute capacitive encoder of claim 1, said stator having printed circuit board having conductive tracks that connect said plurality of conductive sectors to said control unit.

5. The absolute capacitive encoder of claim 1, further comprising:
   a display electrically connected to said control unit so as to display an angular position of said mobile element.

* * * * *